(12) United States Patent
Li et al.

(10) Patent No.: US 9,476,957 B2
(45) Date of Patent: Oct. 25, 2016

(54) METHOD AND APPARATUS FOR ACCELERATING MAGNETIC RESONANCE IMAGING

(71) Applicant: Universitaetsklinikum Freiburg, Freiburg (DE)

(72) Inventors: Guobin Li, Freiburg (DE); Kuan Jin Lee, Erlangen (DE); Maxim Zaitsev, Freiburg (DE); Juergen Hennig, Freiburg (DE); Julius Dragonu, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 627 days.

(21) Appl. No.: 13/948,191

(22) Filed: Jul. 23, 2013

(65) Prior Publication Data
US 2014/0035576 A1 Feb. 6, 2014

(30) Foreign Application Priority Data

Aug. 6, 2012 (EP) .................................... 12179448

(51) Int. Cl.
*G01R 33/56* (2006.01)
*G01R 33/561* (2006.01)
*G01R 33/565* (2006.01)

(52) U.S. Cl.
CPC ....... *G01R 33/5608* (2013.01); *G01R 33/5611* (2013.01); *G01R 33/5619* (2013.01); *G01R 33/5659* (2013.01); *G01R 33/56509* (2013.01); *G01R 33/56563* (2013.01)

(58) Field of Classification Search
CPC .............. G01R 33/5608; G01R 33/56; G01R 33/5611; G01R 33/561; G01R 33/5619; G01R 33/5659; G01R 33/56563; G01R 33/565; G01R 33/56509
See application file for complete search history.

(56) References Cited

U.S. PATENT DOCUMENTS

| 7,557,572 | B1 * | 7/2009 | Hertz .................. G01R 33/565 324/307 |
| 2003/0135105 | A1 | 7/2003 | Jack | |
| 2004/0015072 | A1 | 1/2004 | Pelletier | |
| 2007/0133852 | A1 * | 6/2007 | Collins .................... A61B 8/08 382/128 |
| 2011/0178386 | A1 * | 7/2011 | Grissom ............ G01R 33/4804 600/410 |
| 2011/0241670 | A1 * | 10/2011 | Lai ...................... G01R 33/5611 324/309 |
| 2012/0002859 | A1 | 1/2012 | Huang | |
| 2014/0376794 | A1 * | 12/2014 | Dumoulin .......... G01R 33/5611 382/131 |

OTHER PUBLICATIONS

J.A. Schnabel, et al., "Measurement of hippocampal volume changes in serial MRI scans", SPIE Conference on Image Processing, San Diego, California, Feb. 1999, SPIE vol. 3661, pp. 1367-1376.

(Continued)

*Primary Examiner* — David Gray
*Assistant Examiner* — Laura Roth
(74) *Attorney, Agent, or Firm* — Paul Vincent

(57) ABSTRACT

A method of MRI entails recording and storing MR signals from an object to produce an old set of data. A further measurement of the object is then initiated at a later time to record new MR data, whereby k-space is undersampled in the further measurement. The old data are corrected for changes in the new position of the object, for changes in the sensitivity and exact spatial positioning of the receiver coils as well as for changes in the actual field shimming. The old and new data are then combined to create a new, high resolution image of the object.

13 Claims, 4 Drawing Sheets

(56) References Cited

OTHER PUBLICATIONS

M. Holden et al., "Detecting small anatomical change with 3D serial MR subtraction images", SPIE Conference on Image Processing, San Diego, California, Feb. 1999, SPIE vol. 3661, pp. 44-55.

Mark Holden et al., "Sources and correction of higher order geometrical distortion for serial MR brain imaging", Proceedings of SPIE vol. 4322 (2001), pp. 69-78.

Joop J. Van Valls et al., "Keyhole Method for Accelerating Imaging of Contrast Agent Uptake", JMRI 1993: 3:671-675.

Yummei Chen et al., "A novel method and fast algorithm for MR image reconstruction with significantly under-sampled data", Inverse problems and imaging (IPI), vol. 4, No. 2, May 1, 2010, pp. 223-240.

Yue Cao et al., "Feature-Recognizing MRI", Magnetic Resonance in Medicine, vol. 30, No. 3, Sep. 1, 1993, pp. 305-317.

Guang-Hong Chen et al., "Prior Image Constrained Compressed Sensing (PICCS)", Med. Phys. Feb. 2008; 35(2):660-3.

R. Von Borries et al., Compressed sensing using prior information, Proc. 2nd IEEE Int. Workshop Computational Advances Multi-Sensor Adaptive Processing (CAMPSAP); pp. 121 2007.

Michael Lustig et al., "Sparse MRI: The Application of Compressed Sensing for Rapid MR Imaging", Magn. Reson. Med., 58: 1182-1195.

Mark A. Griswold et al., "Generalized Autocalibrating Partially Parallel Acquisitions (GRAPPA)", Magn. Reson. Med., 47:1202-1210.

Klaas P. Pruessmann et al., "SENSE: Sensitivity Encoding for Fast MRI", Magn. Reson. Med., 42:952-962.

\* cited by examiner

METHOD AND APPARATUS FOR ACCELERATING MAGNETIC RESONANCE IMAGING

This application claims Paris convention priority of EP 12 179 448.1 filed Aug. 6, 2012 the entire disclosure of which is hereby incorporated by reference.

BACKGROUND OF THE INVENTION

The present invention relates to a method of magnetic resonance (MR) imaging with spatial encoding to generate an image of an object of investigation inside an MR apparatus comprising the steps of:
  (a) selecting a volume of interest within the object of investigation;
  (b) applying a radio frequency (RF) pulse to generate a transverse magnetization within the object of investigation
  (c) effecting spatial encoding through application of spatially encoding magnetic fields;
  (d) recording and storing MR signals originating from the object of investigation; and
  (e) repeating steps (a) through (d) for recording further MR signals originating from the same object of investigation to record and store new MR data, whereby step (c) is performed by undersampling the k-space in the further examination for shortening measurement time and whereby the old MR data recorded and stored in step (d) are used together with the new MR data recorded in step (e) for image reconstruction of the object of investigation.

Such method is known from van Vaals J J, Brummer M E, Dixon W T et al. (1993), "Keyhole method for acceleration imaging of contrast agent uptake. J Magn Reson Imaging, 3: 671-675 (hereafter van Vaals et al.). Similar method steps, however in connection with computer tomography (CT), are described in Chen G H, Tang J, Leng S. Prior image constrained compressed sensing (PICCS): a method to accurately reconstruct dynamic CT images from highly undersampled projection data sets. Med Phys. 2008 February; 35(2):660-3 (hereafter Chen et al.). In connection with MR, the above defined steps (a) through (d) are known from Lustig, M., Donoho, D. and Pauly, J. M. (2007), Sparse MRI: The application of compressed sensing for rapid MR imaging. Magn. Reson. Med., 58: 1182-1195 (hereafter Lustig et al.).

Magnetic Resonance Imaging has become an important tool for clinical diagnosis. But with currently developed techniques, MR imaging, especially 3D MRI, is still very slow, compared to other modalities (CT etc.).

Currently, there are several types of methods for accelerating MR imaging: 1) optimal sequence design for higher sampling efficiency; 2) parallel imaging, such as GRAPPA, SENSE etc.; 3) temporal acceleration in dynamic MRI; 4) Compressed Sensing (CS). However, currently all these methods employ only the data from each single examination.

On the other side, each patient will not just have only one MR examination during his life time, especially, in case of need for MR follow-up examinations. Periodical health check-ups with MRI will be welcome and become popular. Repetitive MR examination will be common. However, in this kind of scanning, there might be small part of the tissues changed, and all rest of information are kept the same. A large amount of redundant information exists, which is a potential for the imaging acceleration. But unlike in dynamic MRI, because of the different positioning of the patients, the information from previous examination cannot be used directly in new scan.

The present invention relates to magnetic resonance imaging (MRI) technology and, particularly to a method for accelerating data acquisition and improving image reconstruction.

One object of the present invention is to propose a method for accelerating the MR imaging by adaptive synthesis of the information acquired in the previous examination and the information acquired in the new examination.

Another object of the present invention is to provide an apparatus corresponding to the above mentioned method for the prior information synthesized MRI.

SUMMARY OF THE INVENTION

According to the present invention, these objects are achieved by modifying the initially defined generic method in that the object of investigation is physically removed from the MR apparatus after step (d) and positioned again inside the MR apparatus before starting step (e), that the old MR data recorded in step (d) are corrected for changes in the new position of the object of investigation relative to the MR apparatus in step (e), that the old MR data recorded in step (d) are corrected for changes in the sensitivity and exact spatial positioning of the RF receiver coils of the MR apparatus in step (e), that the old MR data recorded in step (d) are corrected for changes in the actual magnetic field shimming of the MR apparatus in step (e), and that a high resolution MR image of the object of investigation is reconstructed from the synthesis of the old and the new MR data.

In order to achieve the above mentioned objects, the present invention proposes a method for accelerating MRI, comprising: The information obtained in previous MR examination with the same or similar parameters is stored. The MR data acquisition time in new examination is shortened by the undersampling of the k-space.

Said synthesis of the prior information and the information acquired in the new examination contains coarse synthesis and fine synthesis.

Said k-space undersampling pattern in the new examination is optimized according to the specific reconstruction algorithm. For example, in Parallel Imaging (GRAPPA, SENSE etc.), the k-space is regularly undersampled; in Compressed Sensing (/1-norm based reconstruction), the k-space is randomly undersampled.

Said prior information includes acquired k-space data or reconstructed image, and used parameters in previous examination. The time interval between the previous examination and the new examination could be minutes, days or years.

Said coarse synthesis comprises: The prior information is transformed to image space, called prior image. Image registration is performed to align the prior image to the new image. Because the high-quality new image is still unknown at this step, there are two ways to perform the registration. Reconstruction can be carried out with only the new acquired k-space data to obtain the coarsely reconstructed new image (coarse new image). The image registration is performed between the prior image and the coarsely reconstructed image. Alternatively, image registration is performed by iteratively minimizing the k-space difference. The prior image is tentatively moved to new position, and transformed to k-space. If the k-space difference between prior data and the new data is reduced, the new position is accepted. The research procedure may be done iteratively by various descending algorithms, for example conjugate gradient based algorithms. The image registration can be locally optimized, such that better alignment is achieved for those regions without tissue changes or serious non-rigid motion. The aligned prior image is called estimated image.

Said coarse synthesis comprises: The profile of the coarse new image is extracted by low-pass filter or fitting algorithm. The profile of the estimated image is extracted by the identical algorithm applied to the coarse new image. The estimated image is multiplied by the profile of coarse new image, and divided by its own profile. The estimated image is subtracted from the coarse new image to obtain the difference image. The difference image is low-pass filtered. Its signal intensity is normalized to the range of 0~1.0, and inversed to obtain a coarse similarity map. The estimated image and coarse new image is synthesized according to the similarity map to obtain the coarse synthesized image. Higher similarity corresponds to more information from the estimated image.

The resulted coarse synthesized image is transformed to k-space, called coarse synthesized k-space. The coarse synthesized k-space is undersampled with the identical sampling pattern applied in the new examination. A residual difference k-space is obtained by subtracting the coarse synthesized k-space from the new acquired k-space. The residual difference image is calculated with the residual difference k-space by a selected standard reconstruction algorithm again. The residual difference image is converted a weighting map by low-pass filtering.

The final reconstructed image is the fine synthesis of the coarse new image and the coarse synthesized image according to the weighting map.

In order to achieve the above mentioned objects, the present invention proposes an apparatus for accelerating MR imaging, comprising: A central database is built to store the information of the patients. The said information includes acquired MR data and used parameters in its historical examinations. In new examination, MR scanner loads the patient information in the database for configuring the scanning. The image reconstruction unit loads the data from database, and the data from MR scanner, to reconstruction the new image with the above mention method. Image reconstruction unit will update the database after the image reconstruction is finished.

In order to make the aforesaid and other features and advantages of the present invention more apparent to those skilled in the art, preferred embodiments of the present invention will be described in detail below by referring to the accompanying drawings, wherein identical numerals represent the same parts, and in the accompanied drawings:

DESCRIPTION OF THE PREFERRED EMBODIMENT

In order to make the object, technical solution and advantage of the present invention more apparent, the present invention will be further described in detail in conjunction with accompanying drawings and embodiments. It should be understood that the embodiments explained here are merely to explain the present invention; they are not to define the present invention.

Figure 1:
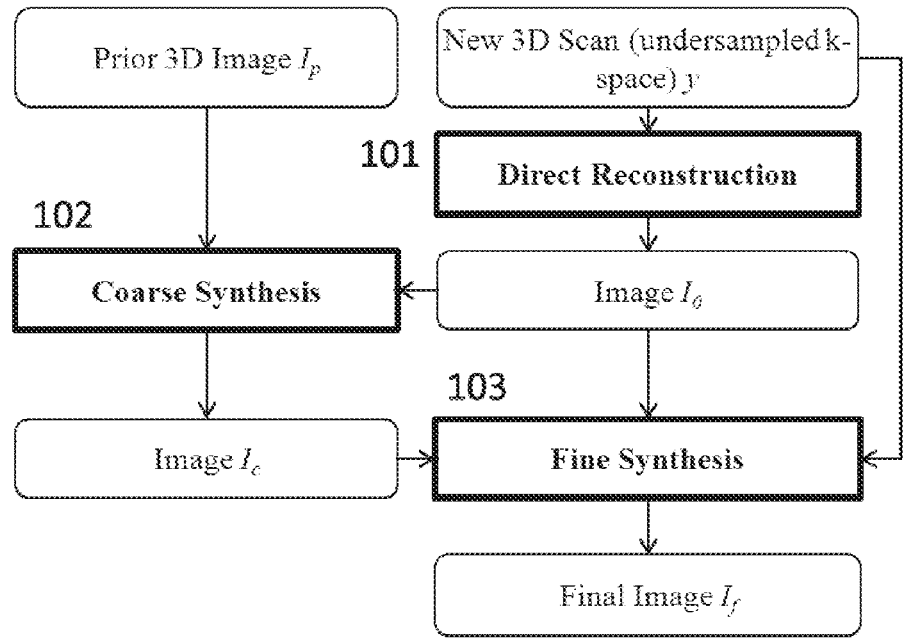
FIG. 1 is a schematic diagram of the prior information integrated reconstruction in 3D MR imaging.

The inventors discovered during the process of making this invention that, the implementation of the invention can be subdivided into 3 steps: S101, S102, and S103 (shown in FIG. 1).

At step S101, the new image $I_0$ is directly reconstructed with only the new acquired k-space data. At step S102, image registration is performed to align the prior image $I_p$ to the position of the new image. At step S103, the estimated image $I_c$ from Step S102 is integrated into the final reconstruction image $I_f$.

Figure 2:
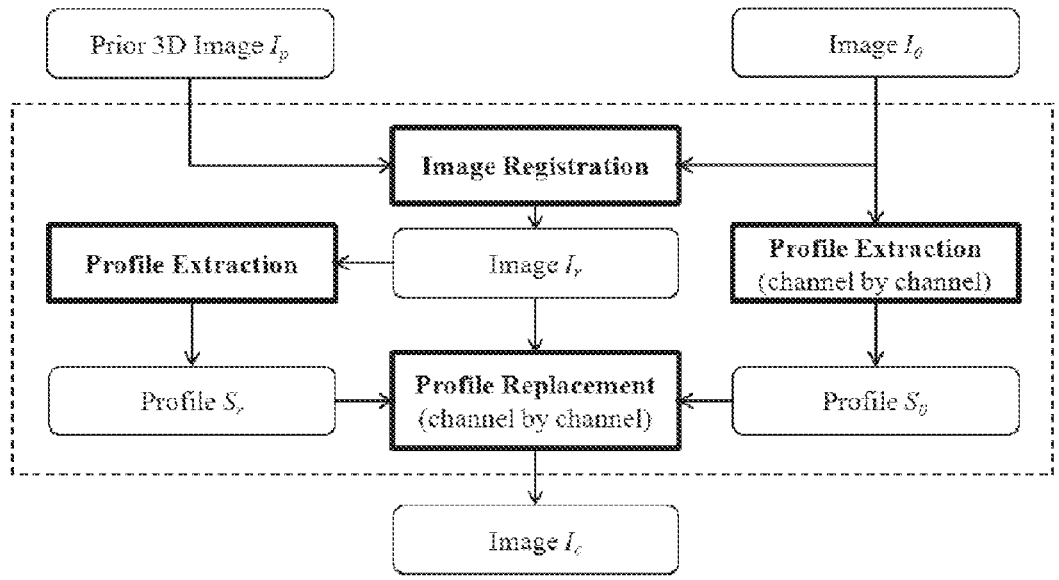
FIG. 2 is a flowchart of a detailed implementation of the step 102 in FIG. 1.

In FIG. 2, channel combination is performed for the reconstructed images in S101 to obtain a magnitude image if the registration is performed in image space. The prior image is aligned to the new image, and an estimated image $I_r$ is obtained. The profiles of the estimated image $S_r$ and the coarsely reconstructed new image $S_0$ are extracted by low-pass filtering. The image profile in the estimated image is updated to the new by a multiplication operation. The estimated image with new profile is adaptively synthesized with coarsely reconstructed new image.

Figure 3:
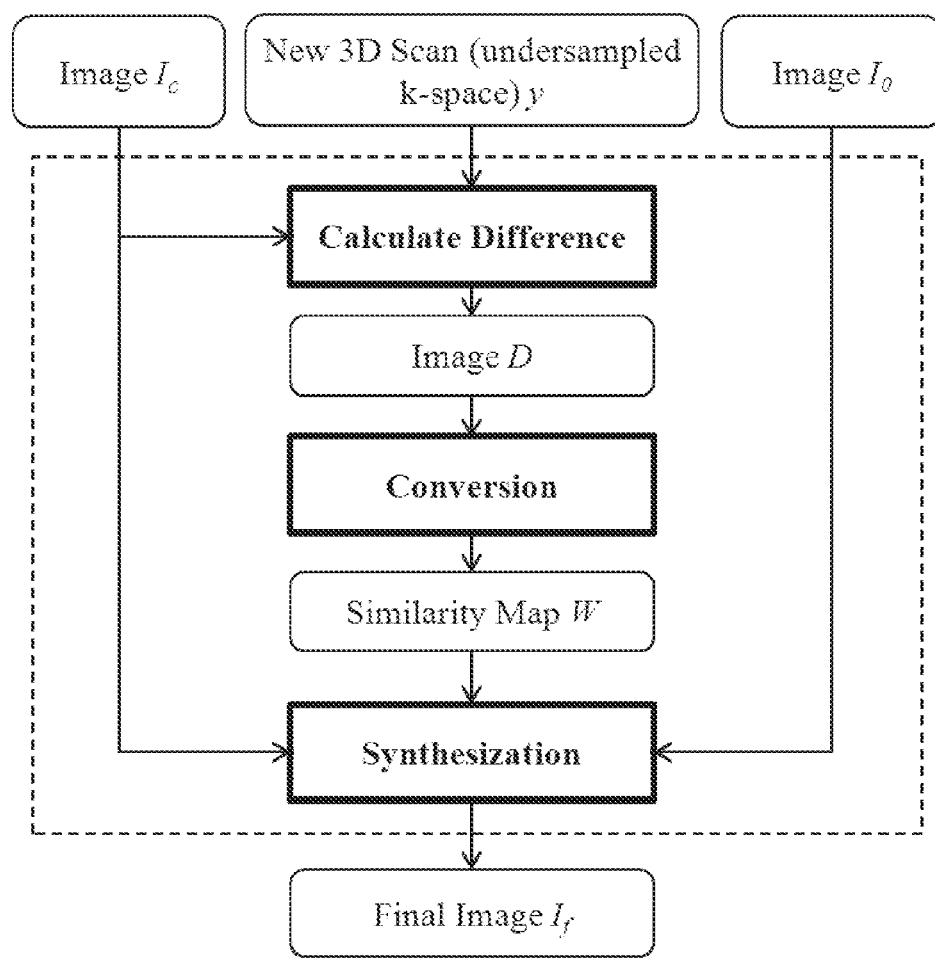
FIG. 3 is a flowchart of a detailed implementation of the step 103 in FIG. 1.

FIG. 3 is a description of step S103. The coarsely synthesized image is transformed to k-space and undersampled with identical sampling mask applied in the new examination. K-space subtraction is performed between the estimated k-space and new acquired k-space to give the residual difference k-space. Reconstruction (for example /1-penalized regularization, GRAPPA etc.) is performed to the resulted residual difference k-space to give the residual difference image D. The final image is obtained by the adaptive synthesis of the estimated image and the coarse new image using a similarity map W extracted from the residual difference image D.

Figure 4:
FIG. 4 is a 3D prior image acquired in previous examination.
Figure 5:
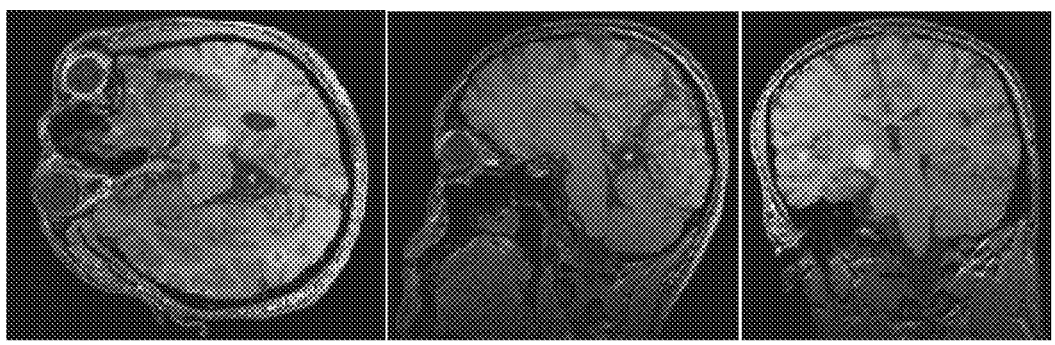
FIG. 5 is a 3D image reconstructed with full sampled k-space in the new examination as a reference for evaluating the reconstructed image quality.
Figure 6:
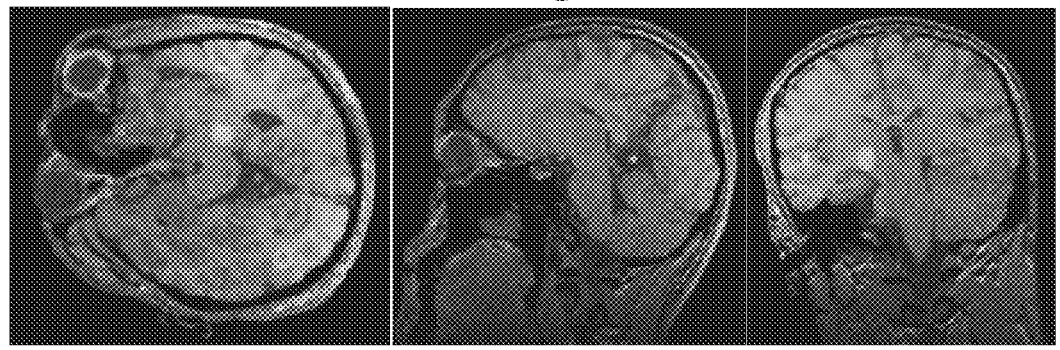
FIG. 6 is a reconstructed 3D image with only the acquired data (k-space sampling pattern in FIG. 4) by compressed sensing reconstruction.
Figure 7:
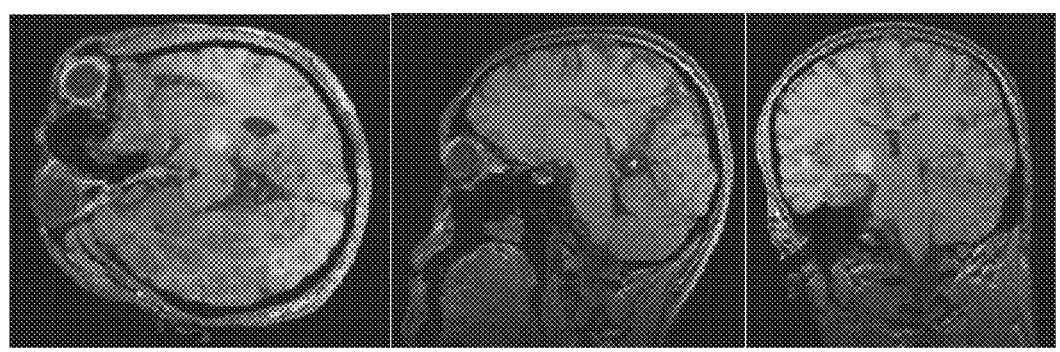
FIG. 7 is a reconstructed 3D image with prior information (FIG. 5) integrated compressed sensing reconstruction, the proposed invention.

This invention has been tested on head MR scanning with 3D GRE sequence with Compressed Sensing based undersampling pattern. The prior data was acquired days before the new examination (FIG. 4). A reference image without acceleration was acquired for comparison and validation of the invention. It is shown that the reconstructed image with prior information (FIG. 7) is superior to the reconstructed image without prior information (FIG. 6).

Figure 8:
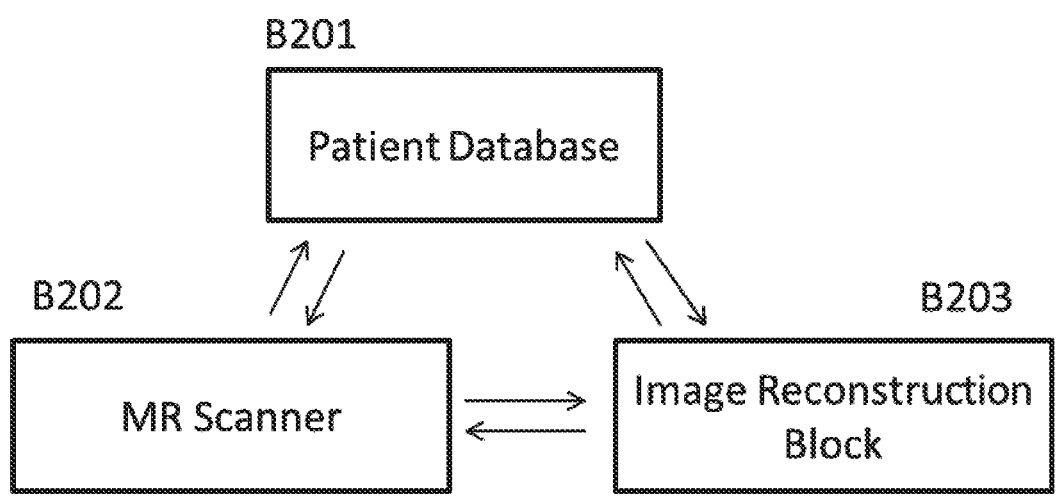
FIG. 8 is a schematic diagram of the apparatus for prior information integrated MR imaging.

FIG. 8 is the apparatus for prior information integrated MR imaging, which contains 3 units: B201, B202, B203; the central database B201 is built to store the information of the patients. The said information includes acquired MR data and used parameters in its historical examinations. In new examination, MR scanner unit B202 loads the patient information in the database for configuring the scanning. The image reconstruction unit B203 loads the data from database, and the data from MR scanner, to reconstruction the new image with the above mention method. Image reconstruction unit B203 will update the database after the image reconstruction is finished.

In the preferred embodiment of the invention, the synthesis of the data from a prior examination and the new examination has the advantages of improving the reconstructed image quality, increasing the signal to noise ratio of the reconstructed image, reducing the artefacts with highly undersampled data, compared to the reconstruction using only the new acquired data.

In another embodiment of the invention, a direct reconstruction of the new acquired data is performed to obtain a coarse new image. The coarse new image includes the information of the new pose of the object in the new examination, as well as the change in B0 and B1 field distributions and radiofrequency coil sensitivities. The coarse new image also includes the information on the physical change of the object in the examination. Reconstructing a coarse new image explicitly has an advantage of making it possible to use a variety of the established image processing methods to track and analyse the above changes.

In another embodiment of the invention, the said aligning the prior image to the coarse new image has the advantage that the change of the subject's position between the old and the new examinations can be compensated for using one of the variety of established image realignment algorithms.

In two further embodiments of the invention, the said extracting the image profiles of both coarse new image and prior image, and the replacement of the image profile of the prior image has the advantages that differences in radiofrequency coil sensitivities can be accounted for. It also has an additional advantage that different radiofrequency coils can be used in both examinations, and the old image can be a magnitude image with all channels combined.

In another embodiment of the invention, the similarity map guided synthesis is used, which has the advantage of avoiding wrong signals from the prior image to be taken into account during the information synthesis.

In another embodiment of the invention, transforming of the coarsely synthesized image into k-space and undersampling it with the identical pattern as used in the new examination has the advantage of directly calculating the k-space difference between the coarsely synthesized image and the true new image.

In another embodiment of the invention, calculating image differences is used to indicate wrong signals in the coarsely synthesized image. The conversion of the image difference to weighting map has the advantage of selectively improving the wrong signals in the process of fine synthesis, and without affecting the high-quality signals in other well-matched regions.

In another preferred embodiment of the invention, different radiofrequency coils or even different scanners are used to perform the old and the new examinations. This has the advantages of allowing a greater freedom for the selection of the settings for the repeated examinations without binding the patients to the particular imaging setups. This is especially advantageous if the repeated examinations take place after months or years since the previous one.

In another embodiment of the invention, the proposed method is combined with a variety of the established imaging techniques, in particular, gradient echo, spin echo, fast low angle shot (FLASH), fast spin echo (FSE), echo planar imaging (EPI). This has the advantages of applying the invention to the clinically-relevant imaging protocols.

In another preferred embodiment of the invention a combination of the proposed imaging scheme is described with the established accelerated imaging techniques which rely on using multiple receiver coils, in particular GRAPPA or SENSE. This has an advantage of allowing for further acceleration of the image acquisition and further shortening of the examination time.

In another preferred embodiment of the invention Compressed Sensing techniques are used in combination with the proposed scheme. This has the advantage of using the sparsity in image space or in transformed domains for the acceleration of the image acquisition also in combination with the proposed imaging scheme according to the present invention.

In another preferred embodiment of the invention, the k-space sampling pattern in the new examination is adapted according to the information from the prior image. It has the advantage of ensuring the acquisition of those important data, which improves the reconstructed image quality without increasing the amount of acquired data. The importance of the k-space data is determined by the used reconstruction algorithm. The prior data helps to determine the positions of these important data in k-space.

Another preferred embodiment of the invention offers an advantage of providing an integrated apparatus for accelerating of the repeated examinations, comprising in particular a database unit to store patient information, an MR scanner unit and an image reconstruction unit.

The present invention discloses a method for accelerating MR examination by integrating the prior information acquired in the previous examination to the new examination. Unlike in dynamic MRI, the previous examination might be performed days or months before the new examination. The data acquired in previous examination cannot be directly integrated into reconstruction of the new image because of motion or difference positioning, and usually it is not used for new image reconstruction. In this invention, the data in previous examination is stored. The new examination is accelerated by k-space undersampling, for example the popular sampling pattern used in Compressed Sensing and Parallel Imaging. Image registration is performed to align the prior image reconstructed in previous examination to the position of the new image. The aligned prior image obtains the new low resolution information (such as coil sensitivities) by image profile replacement, and then is converted to k-space (called estimated k-space). A weighting map is obtained by calculating the difference image between the estimated image and the new image through the reconstruction of their k-space difference. The final image is the adaptively combination of coarse new image and the estimated image according to the obtained weighting map.

REFERENCES

[0] van Vaals J J, Brummer M E, Dixon W T et al. (1993), "Keyhole method for acceleration imaging of contrast agent uptake. J Magn Reson Imaging, 3: 671-675.
[1] Chen G H, Tang J, Leng S. Prior image constrained compressed sensing (PICCS): a method to accurately reconstruct dynamic CT images from highly undersampled projection data sets. Med Phys. 2008 February; 35(2):660-3.
[2] R. von Borries, C. J. Miosso and C. M. Potes "Compressed sensing using prior information", Proc. 2nd IEEE Int. Workshop Computational Advances Multi-Sensor Adaptive Processing (CAMPSAP), pp. 121 2007
[3] Lustig, M., Donoho, D. and Pauly, J. M. (2007), Sparse MRI: The application of compressed sensing for rapid MR imaging. Magn. Reson. Med., 58: 1182-1195.

[4] Griswold, M. A., Jakob, P. M., Heidemann, R. M., Nittka, M., Jellus, V., Wang, J., Kiefer, B. and Haase, A. (2002), Generalized autocalibrating partially parallel acquisitions (GRAPPA). Magn. Reson. Med., 47: 1202-1210.

[5] Pruessmann, K. P., Weiger, M., Scheidegger, M. B. and Boesiger, P. (1999), SENSE: Sensitivity encoding for fast MRI. Magn. Reson. Med., 42: 952-962.

We claim:

1. A method of magnetic resonance (MR) imaging with spatial encoding for generating an image of an object of investigation inside an MR apparatus, the method comprising the steps of:
   a) selecting a volume of interest within the object of investigation;
   b) applying a radio frequency (RF) pulse to generate a transverse magnetization within the object of investigation;
   c) effecting spatial encoding through application of spatially encoding magnetic fields;
   d) recording and storing MR signals originating from the object of investigation and assigning those signals to old MR data;
   e) physically removing the object of investigation from the MR apparatus following step d);
   f) repositioning the object inside the MR apparatus following step e);
   g) repeating steps a) through d) for recording further MR signals originating from the same object of investigation to record and store new MR data, whereby step c) is performed by undersampling the k-space for shortening a measurement time;
   h) correcting the old MR data recorded in step d) for changes in a new position of the object of investigation relative to the MR apparatus in step g);
   i) correcting the old MR data recorded in step d) for changes in a sensitivity and exact spatial positioning of RF receiver coils of the MR apparatus in step g);
   j) correcting old MR data recorded in step d) for changes in an actual B0 magnetic field of the MR apparatus in step g); and
   k) reconstructing a high resolution MR image of the object of investigation from a synthesis of the old MR data recorded and stored in step d) and corrected in steps h), i) and j) with the new MR data recorded in step g).

2. The method of claim 1, wherein a coarse new image is reconstructed based solely on the new MR data recorded in step g), and the coarse new image is used to perform the corrections of steps h), i) and j).

3. The method of claim 2, wherein the corrections in step h) for compensating changes in a new position of the object of investigation relative to the MR apparatus comprise aligning a prior image reconstructed in an old examination to the coarse new image using an image registration method and optimizing an image alignment locally in image space using an iterative procedure.

4. The method of claim 3, wherein information acquired in the old examination and information acquired in a new examination are adaptively synthesized by extracting an image profile of an aligned prior image using a low-pass filter or by extracting the image profile of the aligned prior image using a fitting algorithm and extracting an image profile of the coarse new image using that fitting algorithm.

5. The method of claim 4, wherein the aligned prior image is replaced by multiplying the aligned prior image by the image profile of the coarse new image and dividing by the image profile of the aligned prior image, to obtain an estimated image.

6. The method of claim 4, wherein a similarity map is calculated in coarse scale by subtracting the estimated image from the coarse new image to obtain a difference image, applying a low-pass filter to the difference image to obtain a filtered difference image, inversing a signal intensity of the filtered difference image to obtain the similarity map and using this similarity map to guide a data synthesis step to obtain a coarsely synthesized image, wherein more information is taken from the estimated image in regions with high similarity.

7. The method of claim 6, wherein the coarsely synthesized image is transformed into k-space and undersampled with an identical sampling pattern applied to a new examination to obtain an estimated k-space.

8. The method of claim 7, where the estimated k-space is subtracted from a new acquired k-space to obtain a residual difference k-space and the residual difference k-space is reconstructed with a reconstruction algorithm to obtain a weighting map, wherein the coarsely synthesized image is combined with the coarse new image using the weighting map to obtain a final reconstructed image.

9. The method of claim 1, wherein, in step g), a same MR apparatus is used as in step d), however with different RF coils or wherein, in step g), an MR apparatus different from that in step d) is used.

10. The method of claim 1, wherein one of a conventional MRI sequence, a gradient echo, a spin echo, a fast low angle shot (FLASH), a fast spin echo (FSE) or an echo planar imaging (EPI) is used for generating image data.

11. The method of claim 1, wherein acceleration techniques or acceleration techniques with k-space (GRAPPA) or image space (SENSE) reconstructions are used.

12. The method of claim 1, wherein a compressed sensing technique is used.

13. An apparatus for accelerated recording of MR images using the method of claim 1, the apparatus comprising:
   a database unit built to store patient information including acquired MR data, reconstructed images and used scanning parameters in historical examination;
   an MR scanner unit reading information from said database unit for configuring scanning parameters in a new examination; and
   an image reconstruction unit loading information from said database unit and said MR scanner and integrating prior information into reconstruction of a new image, wherein any new image reconstruction updates said database unit after each examination.

* * * * *